US012177984B2

(12) United States Patent
Shimizu (10) Patent No.: US 12,177,984 B2
(45) Date of Patent: Dec. 24, 2024

(54) ELECTRONIC COMPONENT PACKAGE, ELECTRONIC COMPONENT SERIES, AND ELECTRONIC COMPONENT SERIES FORMING APPARATUS

(71) Applicant: Murata Manufacturing Co., Ltd., Nagaokakyo (JP)

(72) Inventor: Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1070 days.

(21) Appl. No.: 17/038,639

(22) Filed: Sep. 30, 2020

(65) Prior Publication Data

US 2021/0112691 A1    Apr. 15, 2021

(30) Foreign Application Priority Data

Oct. 11, 2019  (JP) .................................. 2019-188101

(51) Int. Cl.
*H05K 13/02*    (2006.01)
*H05K 13/04*    (2006.01)

(52) U.S. Cl.
CPC ..... *H05K 13/0215* (2018.08); *H05K 13/0419* (2018.08)

(58) Field of Classification Search
CPC ..... H05K 13/0084; H05K 2201/10681; H05K 13/0417; H05K 13/0419; H05K 13/0215; B65D 2585/86; B65D 75/327; H01L 21/67132
USPC ................................................ 206/713–716
See application file for complete search history.

(56) References Cited

U.S. PATENT DOCUMENTS

| 6,469,372 B2 * | 10/2002 | Hayden ............. H01L 21/67132 257/679 |
| 6,547,076 B1 * | 4/2003 | Pylant .................. B65D 75/327 206/713 |
| 7,584,853 B2 * | 9/2009 | Yoshii ................ H05K 13/0084 206/813 |

(Continued)

FOREIGN PATENT DOCUMENTS

| JP | 06-278713 A | 10/1994 |
| JP | 08-9372 B2 | 1/1996 |

(Continued)

OTHER PUBLICATIONS

Official Communication issued in corresponding Korean Patent Application No. 10-2020-0128467, mailed on Nov. 19, 2021.

(Continued)

*Primary Examiner* — Chun Hoi Cheung
(74) *Attorney, Agent, or Firm* — Keating & Bennett, LLP (57) ABSTRACT

An electronic component package includes a base tape having an elongated shape and including housing portions, each of which houses an electronic component, and a cover tape covering the base tape. The electronic component package includes first and second seal portions welded to sandwich the housing portions between the first and second seal portions and be parallel or substantially parallel to a longitudinal direction x of the electronic component package. A peeling strength of the first seal portion between the base tape and the cover tape is higher than a peeling strength of the second seal portion between the base tape and the cover tape.

9 Claims, 7 Drawing Sheets

(56) References Cited

U.S. PATENT DOCUMENTS

| | | | |
|---|---|---|---|
| 8,875,895 B2* | 11/2014 | Sasamura | H05K 13/0084 |
| | | | 206/713 |
| 11,708,204 B2* | 7/2023 | Shimizu | B65D 75/367 |
| | | | 206/714 |
| 11,725,120 B2* | 8/2023 | Kuo | C09J 7/20 |
| | | | 206/714 |
| 2004/0124119 A1* | 7/2004 | Ahn | H05K 13/0084 |
| | | | 206/714 |
| 2005/0241988 A1 | 11/2005 | Hirata et al. | |
| 2006/0138019 A1* | 6/2006 | Yoshii | H05K 13/0084 |
| | | | 206/714 |
| 2007/0074996 A1* | 4/2007 | Nice | H05K 13/0084 |
| | | | 206/714 |
| 2008/0000804 A1* | 1/2008 | Carey | H05K 13/0084 |
| | | | 206/714 |
| 2009/0123695 A1* | 5/2009 | Han | H05K 13/0084 |
| | | | 428/134 |
| 2011/0243695 A1 | 10/2011 | Hwang et al. | |
| 2013/0193016 A1* | 8/2013 | Sasamura | B65D 73/02 |
| | | | 206/389 |

FOREIGN PATENT DOCUMENTS

| | | |
|---|---|---|
| JP | 08-40548 A | 2/1996 |
| JP | H0840458 A | 2/1996 |
| JP | 2000-344210 A | 12/2000 |
| JP | 2005-022732 A | 1/2005 |
| JP | 2007-246113 A | 9/2007 |
| JP | 2008-222256 A | 9/2008 |
| JP | 2011-211169 A | 10/2011 |
| JP | 2014-034405 A | 2/2014 |
| JP | 2016-034849 A | 3/2016 |
| KR | 10-0809158 B1 | 3/2008 |

OTHER PUBLICATIONS

Official Communication issued in corresponding Chinese Patent Application No. 202011036909.4, mailed on Jan. 29, 2022.
Office Action in KR1020220182560, mailed Oct. 11, 2023, 10 pages.

* cited by examiner

ELECTRONIC COMPONENT PACKAGE, ELECTRONIC COMPONENT SERIES, AND ELECTRONIC COMPONENT SERIES FORMING APPARATUS

CROSS REFERENCE TO RELATED APPLICATIONS

This application claims the benefit of priority to Japanese Patent Application No. 2019-188101 filed on Oct. 11, 2019. The entire contents of this application are hereby incorporated herein by reference.

BACKGROUND OF THE INVENTION

1. Field of the Invention

The present invention relates to electronic component packages, electronic component series, and electronic component series forming apparatuses.

2. Description of the Related Art

Figure 12:
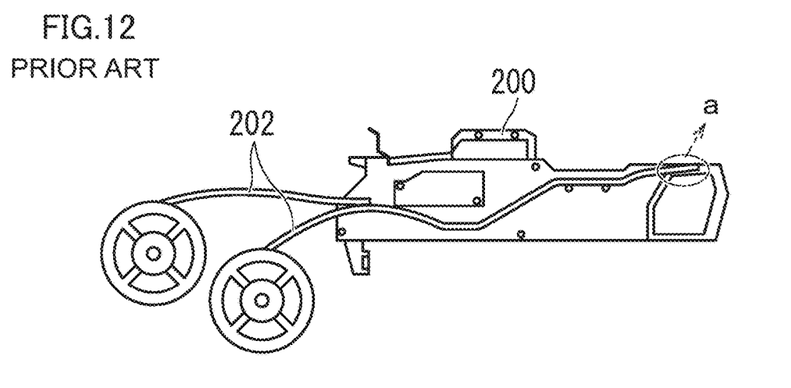
FIG. 12 illustrates a conventional automatic component feeder.
Figure 13:
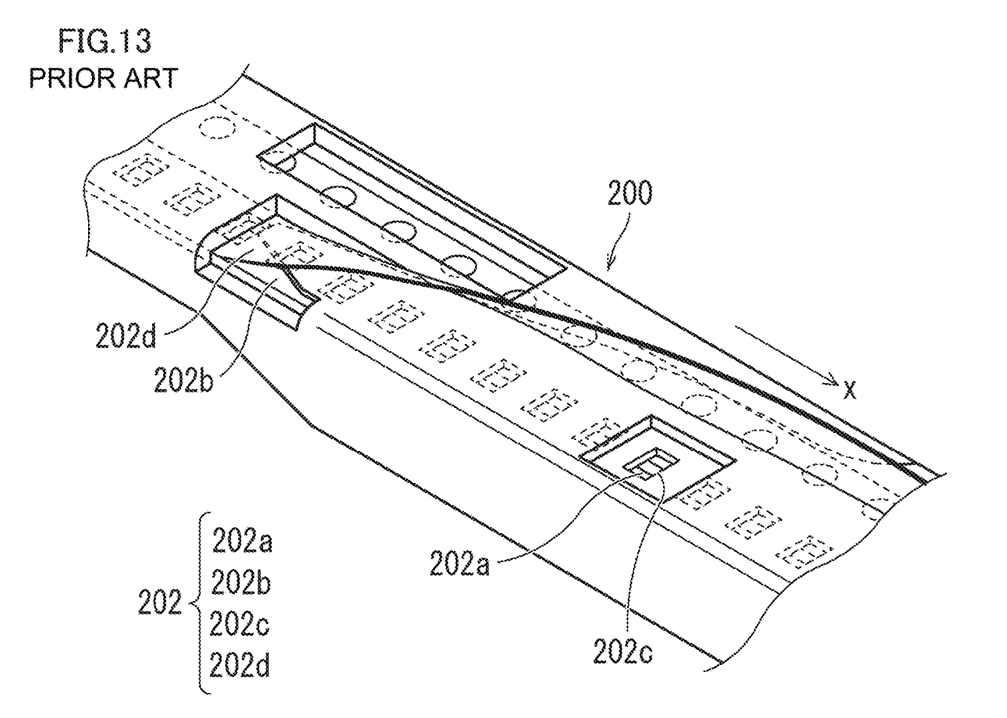
FIG. 13 is an enlarged view of a portion a in FIG. 12.

Conventionally, for example, a carrier tape supply device (automated component feeder) as disclosed in Japanese Patent Laid-Open No. 2011-211169 or shown in FIG. 12 has been used as an automatic component feeder that supplies electronic components to a nozzle of a component mounting device that mounts the electronic components on a substrate. For example, an automatic component feeder 200 as shown in FIG. 12 is loaded with electronic component series 202 wound around reels, and can automatically exchange the reels as it runs out of electronic component series 202. Automatic component feeder 200 of FIG. 12 also peels off one side of a cover tape 202d of electronic component series 202 to expose housing portions 202c of a base tape 202b, as shown in FIG. 13. Electronic components 202a housed in housing portions 202c are picked up (e.g., attracted) by a nozzle of a component mounting device (not shown), so as to be mounted on the substrate.

Electronic component series 202 used in automatic component feeder 200 includes electronic components 202a, base tape 202b provided with housing portions 202c that house electronic components 202a, and cover tape 202d formed to cover base tape 202b, for example, as disclosed in Japanese Patent Laid-Open No. 2014-34405 and Japanese Patent Laid-Open No. 08-40548 and shown in FIG. 13. Electronic component series 202 is welded at seal portions (not shown) provided to sandwich housing portions 202c between the seal portions and be parallel to the direction of transport of the electronic components.

In welding of the base tape and the cover tape, however, when the seal portions on the opposite sides have the same seal strength, the automatic component feeder may fail to peel off one side of the cover tape which is to be peeled off by the automatic component feeder, thus failing to expose the housing portions of the base tape. If the housing portions of the base tape are not exposed, the electronic components cannot be picked up by the nozzle of the component mounting device, which may lead to poor mounting of the electronic components.

SUMMARY OF THE INVENTION

Preferred embodiments of the present invention provide electronic component packages, electronic component series, and electronic component series forming apparatuses that each reduce or prevent poor mounting when an automatic component feeder is used.

An electronic component package according to a preferred embodiment of the present invention includes a base tape having elongated shape provided with a plurality of housing portions, each of the plurality of housing portions housing an electronic component, and a cover tape disposed to cover the base tape. The electronic component package includes a first seal portion and a second seal portion welded to sandwich the plurality of housing portions between the first and second seal portions and be parallel or substantially parallel to a longitudinal direction of the electronic component package. A peeling strength of the first seal portion between the base tape and the cover tape is higher than a peeling strength of the second seal portion between the base tape and the cover tape.

In an electronic component package according to a preferred embodiment of the present invention, the peeling strength of the first seal portion on one side of the electronic component package is higher than the peeling strength of the second seal portion on the other side, which enables the automatic component feeder to peel off the second seal portion side more easily. Since the second seal portion can be peeled off more easily, the housing portions of the base tape can be exposed easily, so as to reduce or prevent the occurrence of poor mounting. Also, the cover tape and the base tape are transported while being bonded to each other, thus preventing clogging caused by the cover tape adhering to the inside of the automatic component feeder. Further, the cover tape and the base tape are transported while being bonded to each other, leading to high disposability.

An electronic component series forming apparatus according to a preferred embodiment of the present invention manufactures an electronic component series including an electronic component, a base tape provided with a housing portion that houses the electronic component, and a cover tape disposed to cover the base tape. The electronic component series forming apparatus includes a welding portion that welds the cover tape and the base tape to each other, a tape feeding portion that transports the cover tape and the base tape to the welding portion, a component inserting portion that inserts the electronic component into the housing portion of the base tape, and a tape wind-up portion that winds up the electronic component series with the cover tape and the base tape welded to each other. The welding portion includes a heat seal trowel to weld the cover tape and the base tape to each other. The heat seal trowel includes a first pressing portion and a second pressing portion in parallel or substantially in parallel with a direction of transport of the electronic component. A peeling strength between the base tape and the cover tape welded to each other by the first pressing portion is higher than a peeling strength between the base tape and the cover tape welded to each other by the second pressing portion.

In an electronic component series forming apparatus according to a preferred embodiment the present invention, the peeling strength between the base tape and the cover tape welded to each other by the first pressing portion of the heat seal trowel is higher than the peeling strength between the second pressing portion and the base tape welded to each other by the second pressing portion of the heat seal trowel, and accordingly, the peeling strength of the electronic component series manufactured by the electronic component series forming apparatus is higher on one side, thus easily exposing the housing portion of the base tape.

Preferred embodiments of the present invention are each able to provide electronic component packages, electronic component series, and electronic component series forming apparatuses that reduce or prevent poor mounting when an automatic component feeder is used.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An electronic component package 10, an electronic component series 50, and an electronic component series forming apparatus 100 according to a preferred embodiment of the present invention will now be described with reference to the drawings. In the description of the following preferred embodiments, the same or corresponding portions will be described with the same reference characters.

The direction of transport of an electronic component 14 is an x direction, and the direction orthogonal or substantially orthogonal to the x direction is a y direction. Thus, the longitudinal direction of electronic component package 10 is in the x direction, and the transverse direction of electronic component package 10 is in the y direction.

1. Electronic Component Package

Figure 1:
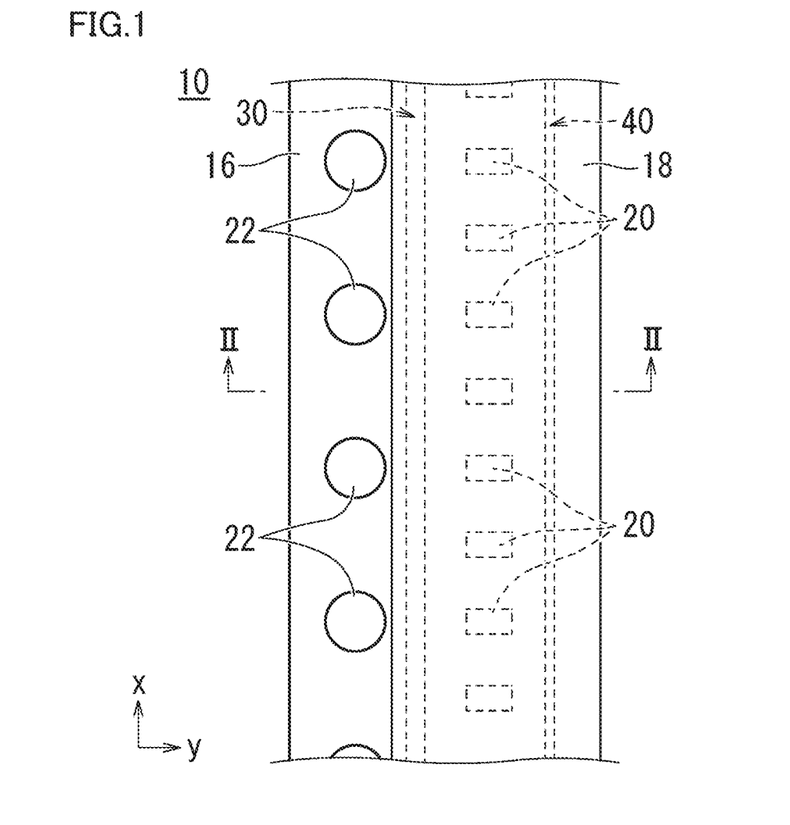
FIG. 1 is a plan view of an electronic component package according to a preferred embodiment of the present invention.
Figure 2:
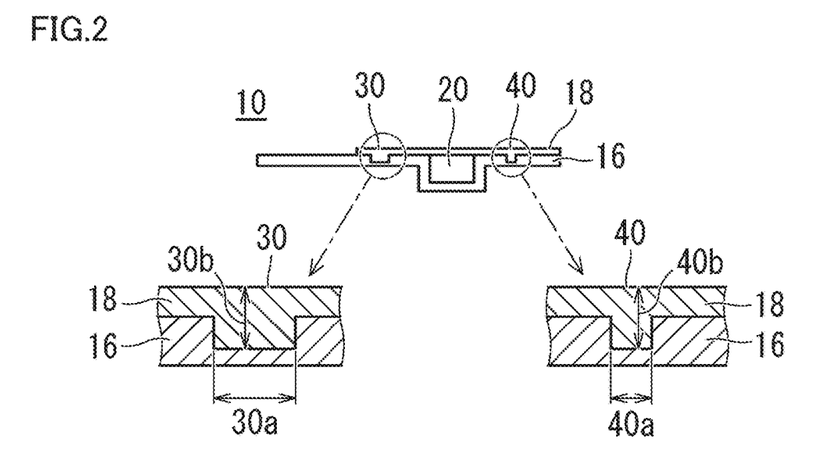
FIG. 2 is a sectional view taken along the line II-II in FIG. 1.

Electronic component package 10 according to a preferred embodiment of the present invention will be described with reference to FIGS. 1 and 2. FIG. 1 is a plan view of an electronic component package according to a preferred embodiment of the present invention. FIG. 2 is a sectional view taken along the line II-II in FIG. 1.

Electronic component package 10 according to a preferred embodiment of the present invention includes a base tape 16 having an elongated shape, which is provided with a plurality of housing portions 20 each housing electronic component 14, and a cover tape 18, which covers base tape 16.

Base tape 16 has an elongated shape, and in the longitudinal direction of base tape 16, housing portions 20 that house electronic components 14 in line at predetermined intervals and feed holes 22 are provided. Housing portions 20 are disposed while being shifted toward one side in a width direction y of base tape 16. A space having a rectangular or approximately rectangular parallelepiped shape is provided in housing portion 20. An opening of housing portion 20 is rectangular or approximately rectangular in plan view. Feed holes 22 are provided for automatic transport in an automatic component feeder. Feed holes 22 engage with teeth of the automatic component feeder which are provided for automatic transport and transport base tape 16 in direction of transport x.

Base tape 16 is made of resin or paper, for example. In particular, base tape 16 is preferably made of one of polystyrene, polyethylene terephthalate, polycarbonate, and polypropylene, for example. Such a material facilitates molding of housing portion 20 and also enables work in a clean room.

Cover tape 18 is attached onto a surface of base tape 16 on one side so as to cover housing portions 20 of base tape 16. Cover tape 18 is disposed so as not to block feed holes 22 of base tape 16.

Cover tape 18 is preferably made of, for example, polyethylene terephthalate. Although cover tape 18 may be made of the same material as that of base tape 16, cover tape 18 is preferably made of a material having a low electrical resistance value. Cover tape 18 made of the material having a low electrical resistance value can be prevented from becoming charged.

Electronic component package 10 includes a first seal portion 30 and a second seal portion 40, which are welded to sandwich housing portions 20 between first seal portion 30 and second seal portion 40 and be parallel or substantially parallel to a longitudinal direction x of electronic component package 10. First seal portion 30 is a welded portion in adjacent to or in a vicinity of feed holes 22 of base tape 16. Second seal portion 40 is a welded portion spaced apart from feed holes 22 of base tape 16.

A peeling strength of first seal portion 30 between base tape 16 and cover tape 18 is denoted as A, and a peeling strength of second seal portion 40 between base tape 16 and cover tape 18 is denoted as B. Peeling strength A of first seal portion 30 between base tape 16 and cover tape 18 is higher than peeling strength B of second seal portion 40 between base tape 16 and cover tape 18. Peeling strength A of first seal portion 30 which is higher than peeling strength B of second seal portion 40 enables second seal portion 40 to be peeled off easily. As the second seal portion 40 side is peeled off easily, housing portions 20 of base tape 16 can be exposed easily, so as to reduce or prevent the occurrence of poor mounting. Further, first seal portion 30 having a high peeling strength enables the cover tape and the base tape to be transported without peeling off of cover tape 18, which prevents clogging caused by cover tape 18 adhering to the inside of the automatic component feeder. Also, the cover tape and the base tape are transported while being bonded to each other, leading to high disposability. Further, peeling strength A of first seal portion 30 between base tape 16 and cover tape 18 and peeling strength B of second seal portion 40 between base tape 16 and cover tape 18 are preferably such that about $1.2 \leq A/B \leq$ about 5.0, for example. Since such peeling strengths can lead to a difference between peeling strength A and peeling strength B, second seal portion 40 can be peeled off more easily.

The sum of peeling strength A of first seal portion 30 between base tape 16 and cover tape 18 and peeling strength B of second seal portion 40 between base tape 16 and cover tape 18 is preferably not less than about 0.1 N and not greater than about 1.0 N, for example.

A length 30a of first seal portion 30 in the width direction is preferably larger than a length 40a of second seal portion 40 in the width direction. As lengths 30a and 40a of first seal portion 30 and second seal portion 40 in the width direction are adjusted, the peeling strengths can be adjusted. Since length 30a of first seal portion 30 in the width direction is larger than length 40a of second seal portion 40 in the width direction, peeling strength A of first seal portion 30 is higher than peeling strength B of second seal portion 40.

An average depth 30b of first seal portion 30 is preferably larger than an average depth 40b of second seal portion 40. This enables the peeling strengths of first seal portion 30 and second seal portion 40 to be adjustable. As average depth 30b of first seal portion 30 is larger than average depth 40b of second seal portion 40, peeling strength A of first seal portion 30 is higher than peeling strength B of second seal portion 40. Average depth 30b of first seal portion 30 and average depth 40b of second seal portion 40 are obtained by measuring the depths of first seal portion 30 and second seal portion 40 in a certain range with a laser displacement meter.

Electronic component package 10 is preferably sealed over the entire or substantially the entire lengths of base tape 16 and cover tape 18. This eliminates the need to cut the portion in which electronic components 14 are housed in installment of the electronic component series, which is performed by the worker, in the automatic component feeder.

2. Electronic Component Series

Figure 3:
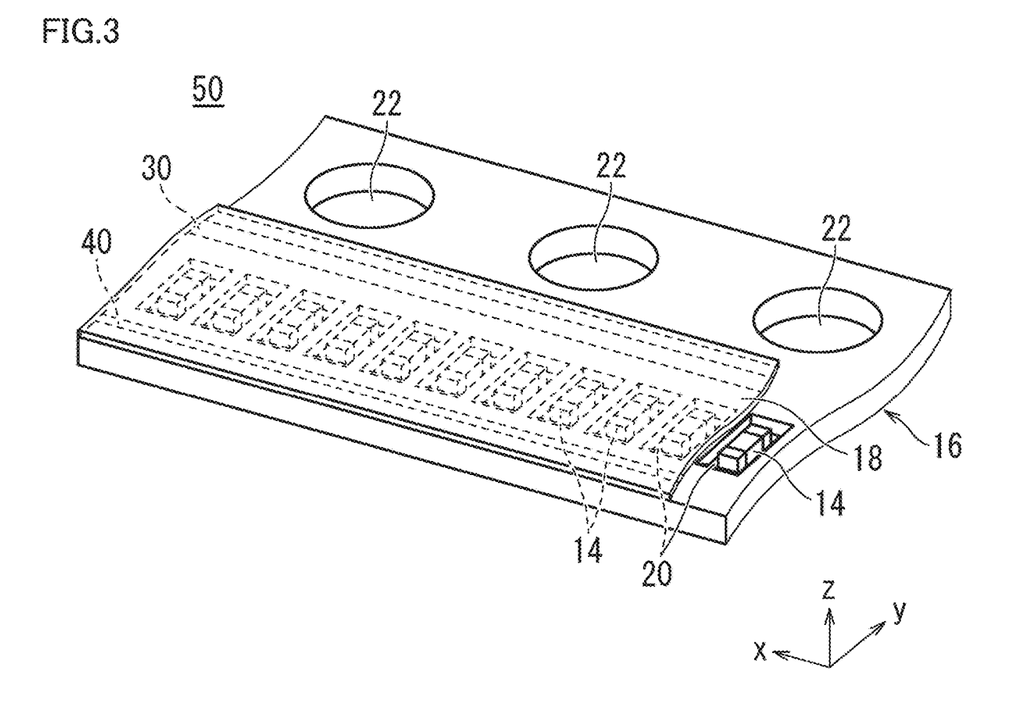
FIG. 3 is a perspective view of an electronic component series according to a preferred embodiment of the present invention.

Electronic component series 50 according to a preferred embodiment of the present invention will be described with reference to FIG. 3. FIG. 3 is a perspective view of an electronic component series according to a preferred embodiment of the present invention.

Electronic component series 50 according to a preferred embodiment of the present invention includes base tape 16 of electronic component package 10 described above, electronic components 14 housed in housing portions 20 of base tape 16, and cover tape 18 of electronic component package 10 described above.

Electronic component 14 is preferably, for example, a resistor, a capacitor, an inductor, a switch, a connector, or a coil. A multilayer ceramic capacitor 14 will be described as an example of electronic component 14. Although the present preferred embodiment will describe multilayer ceramic capacitor 14 as a preferred embodiment of electronic component 14, electronic component 14 is not limited to multilayer ceramic capacitor 14.

Figure 4:
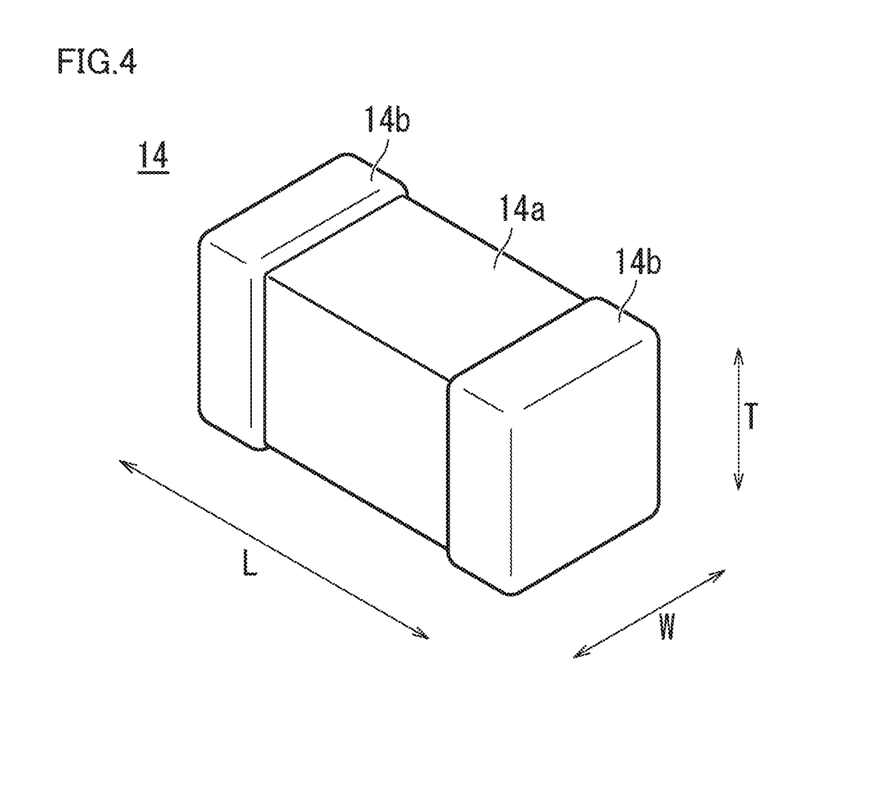
FIG. 4 is a perspective view of a multilayer ceramic capacitor according to a preferred embodiment of the present invention.

Multilayer ceramic capacitor 14 will be described with reference to FIG. 4. FIG. 4 is a perspective view of a multilayer ceramic capacitor according to a preferred embodiment of the present invention.

Multilayer ceramic capacitor 14 includes a multilayer body 14a having a rectangular or substantially rectangular parallelepiped outer shape and a pair of external electrodes 14b, which are provided at opposite ends of multilayer body 14a.

For the outer shape of multilayer ceramic capacitor 14 including external electrodes 14b, for example, multilayer ceramic capacitor 14 preferably has a dimension of not less than about 0.25 mm and not greater than about 3.2 mm in longitudinal direction L, a dimension of not less than about 0.125 mm and not greater than about 2.5 mm in width direction W, and a dimension of not less than about 0.125 mm and not greater than about 2.5 mm in a height direction T.

Electronic component series 50 is preferably used in a tape feeder that automatically supplies electronic components 14.

3. Electronic Component Series Forming Apparatus

Figure 5:
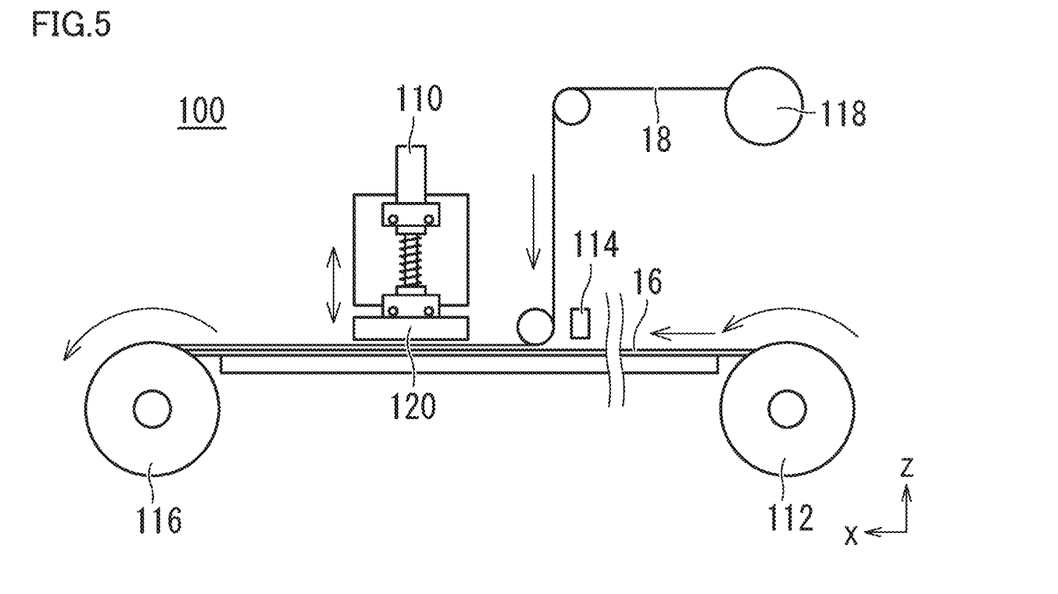
FIG. 5 illustrates an electronic component series forming apparatus according to a preferred embodiment of the present invention.

Next, electronic component series forming apparatus 100 according to a preferred embodiment of the present invention will be described with reference to FIG. 5. FIG. 5 illustrates an electronic component series forming apparatus according to a preferred embodiment of the present invention.

Electronic component series forming apparatus 100 according to a preferred embodiment of the present invention is used to manufacture electronic component series 50 including electronic components 14, base tape 16 provided with housing portions 20 that house electronic components 14, and cover tape 18 formed to cover base tape 16.

Electronic component series forming apparatus 100 includes a welding portion 110, which welds base tape 16 and cover tape 18 to each other, a tape feeding portion 112, which transports base tape 16 and cover tape 18 to welding portion 110, a component inserting portion 114, which inserts electronic components 14 into housing portions 20 of base tape 16, and a tape wind-up portion 116, which winds up electronic component series 50 with base tape 16 and cover tape 18 welded to each other.

Welding portion 110 includes a heat seal trowel 120 to weld base tape 16 and cover tape 18 to each other. Heat seal trowel 120 is heated to a predetermined temperature by a heater and welds base tape 16 and cover tape 18 that travel at constant time intervals to each other. Welding portion 110 performs an up-and-down movement in a height direction z of electronic component series forming apparatus 100 in tandem with base tape 16 and cover tape 18 that travel at constant time intervals, so as to weld base tape 16 and cover tape 18 to each other.

Figure 6A:
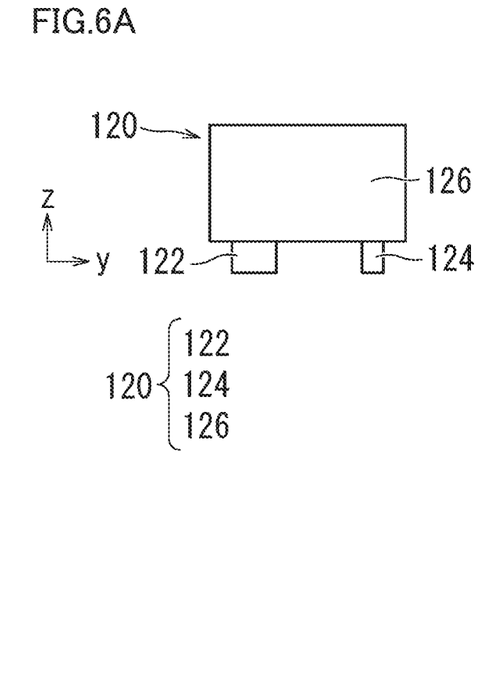
FIG. 6A is a front view of a heat seal trowel according to Preferred Embodiment 1 of the present invention.
Figure 6B:
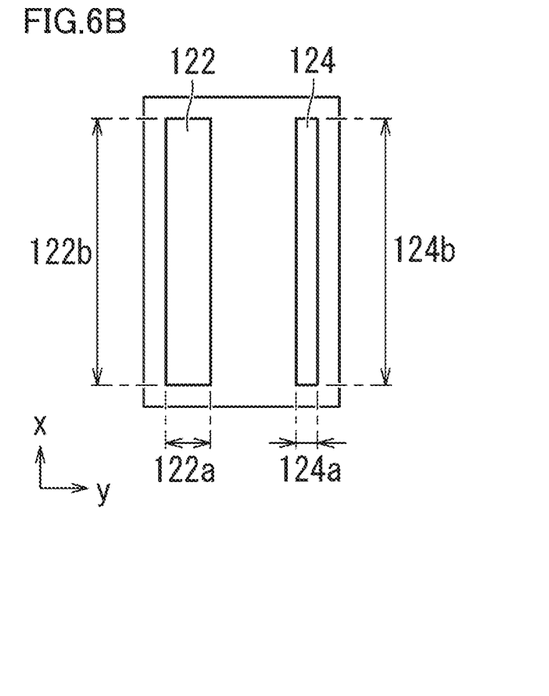
FIG. 6B is a bottom view of the heat seal trowel according to Preferred Embodiment 1 of the present invention.

Heat seal trowel 120 includes a first pressing portion 122 and a second pressing portion 124 in parallel or substantially in parallel with direction of transport x of electronic components 14, as shown in FIGS. 6A and 6B, for example. First pressing portion 122 and second pressing portion 124 are connected to a base material 126. The peeling strength between base tape 16 and cover tape 18 that are welded to each other by first pressing portion 122 is higher than the peeling strength between base tape and cover tape 18 welded to each other by second pressing portion 124. Such an apparatus enables peeling strength A obtained through welding by first pressing portion 122 to be higher than peeling strength B obtained through welding by second pressing portion 124. This enables the peeling strength to be higher on one side of electronic component series 50 manufactured by electronic component series forming apparatus 100 according to the present invention, thus easily exposing housing portions 20 of base tape 16. Further, electronic component series forming apparatus 100 is preferably configured such that about $1.2 \leq A/B \leq$ about 5.0, for example, where A denotes the peeling strength between base tape 16 and cover tape 18 that are welded to each other by first pressing portion 122 and B denotes the peeling strength between base tape 16 and cover tape 18 welded to each other by second pressing portion 124. Since such peeling strengths can cause a difference between peeling strength A and peeling strength B, second seal portion 40 can be peeled off more easily.

Tape feeding portion 112 is provided with feed teeth that transport base tape 16 in direction of transport x. The feed teeth of tape feeding portion 112 are provided to engage with feed holes 22 provided in base tape 16 to transport base tape 16 in direction of transport x.

Component inserting portion 114 inserts electronic components 14 individually into housing portions 20 of base tape 16. After component inserting portion 114 inserts electronic components 14, base tape 16 is supplied with cover tape 18 so as to cover housing portions 20 of base tape 16 in which electronic components 14 are housed, so as to be welded to cover tape 18 in welding portion 110. Cover tape 18 is supplied continuously from a cover tape supply portion 118 provided above electronic component series forming apparatus 100. As cover tape 18 is welded to base tape 16 in which electronic components 14 are housed in housing portions 20, electronic component series 50 is manufactured.

Tape wind-up portion 116 is a portion around which the manufactured electronic component series 50 is wound. Electronic component series 50 manufactured through welding in welding portion 110 is transported further, so as to be wound around a reel provided in tape wind-up portion 116.

Heat seal trowel 120 is preferably provided as described below such that the peeling strength between base tape 16 and cover tape 18 welded to each other by first pressing portion 122 is higher than the peeling strength between base tape 16 and cover tape 18 welded to each other by second pressing portion 124.

In the following, a length of first pressing portion 122 of heat seal trowel 120 in width direction y is denoted as 122a, and a length of second pressing portion 124 of heat seal trowel 120 in width direction y is denoted as 124a. Also, a length of first pressing portion 122 of heat seal trowel 120 in length direction x is denoted as 122b, and a length of second pressing portion 124 of heat seal trowel 120 in length direction x is denoted as 124b. Further, a length of first pressing portion 122 of heat seal trowel 120 in height direction z is denoted as 122c, and a length of second pressing portion 124 of heat seal trowel 120 in height direction z is denoted as 124c.

When first pressing portion 122 and second pressing portion 124 each abut against cover tape 18, an area in which first pressing portion 122 contacts base tape 16 with cover tape 18 between first pressing portion 122 and base tape 16 is preferably larger than an area in which second pressing portion 124 contacts base tape 16 with cover tape 18 between second pressing portion 124 and base tape 16. As first pressing portion 122 and second pressing portion 124 are provided in this manner, the peeling strength between base tape 16 and cover tape 18 welded to each other by first pressing portion 122 can be higher than the peeling strength between base tape 16 and cover tape 18 welded to each other by second pressing portion 124.

Preferred Embodiment 1 of Heat Seal Trowel

Preferred Embodiment 1 of heat seal trowel 120 will be described with reference to FIGS. 6A and 6B. FIG. 6A is a front view of the heat seal trowel according to Preferred Embodiment 1 of the present invention. FIG. 6B is a bottom view of the heat seal trowel according to Preferred Embodiment 1 of the present invention.

For a length of heat seal trowel 120 in width direction y, length 122a of pressing portion 122 in width direction y is preferably larger than length 124a of second pressing portion 124 in width direction y. As first pressing portion 122 and second pressing portion 124 are provided in this manner, the peeling strength between base tape 16 and cover tape 18 welded to each other by first pressing portion 122 can be higher than the peeling strength between base tape 16 and cover tape 18 welded to each other by second pressing portion 124.

Preferred Embodiment 2 of Heat Seal Trowel

Figure 7A:
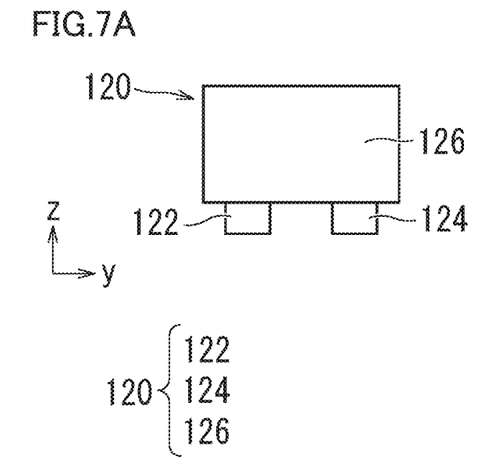
FIG. 7A is a front view of a heat seal trowel according to Preferred Embodiment 2 of the present invention.
Figure 7B:
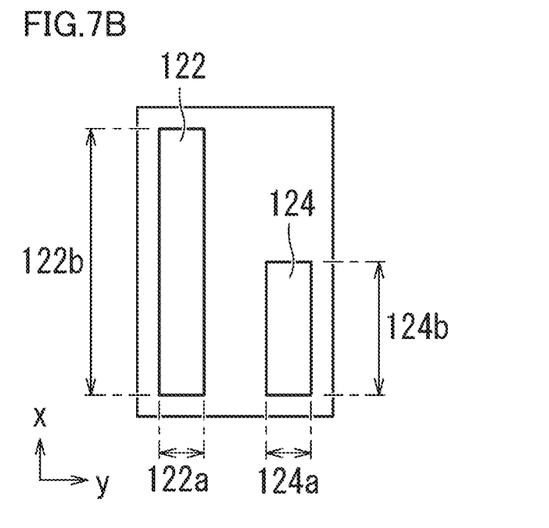
FIG. 7B is a bottom view of the heat seal trowel according to Preferred Embodiment 2 of the present invention.

Preferred Embodiment 2 of heat seal trowel 120 will be described with reference to FIGS. 7A and 7B. FIG. 7A is a front view of the heat seal trowel according to Preferred Embodiment 2 of the present invention. FIG. 7B is a bottom view of the heat seal trowel according to Preferred Embodiment 2 of the present invention.

Length 122b of first pressing portion 122 in length direction (direction of transport) x is preferably larger than length 124b of second pressing portion 124 in length direction x. As first pressing portion 122 and second pressing portion 124 are provided in this manner, first seal portion 30 formed by first pressing portion 122 is welded more frequently than second seal portion 40 formed by second pressing portion 124. Thus, the peeling strength between base tape 16 and cover tape 18 welded to each other by first pressing portion 122 can be higher than the peeling strength between base tape 16 and cover tape 18 welded to each other by second pressing portion 124.

When first pressing portion 122 and second pressing portion 124 each abut against cover tape 18, the pressing force exerted on base tape 16 by first pressing portion 122 with cover tape 18 between base tape 16 and first pressing portion 122 is preferably higher than the pressing force exerted on base tape 16 by second pressing portion 124 with cover tape 18 between base tape 16 and second pressing portion 124. As first pressing portion 122 and second pressing portion 124 are provided in this manner, the peeling strength between base tape 16 and cover tape 18 welded to each other by first pressing portion 122 can be higher than the peeling strength between base tape 16 and cover tape 18 welded to each other by second pressing portion 124.

Preferred Embodiment 3 of Heat Seal Trowel

Figure 8A:
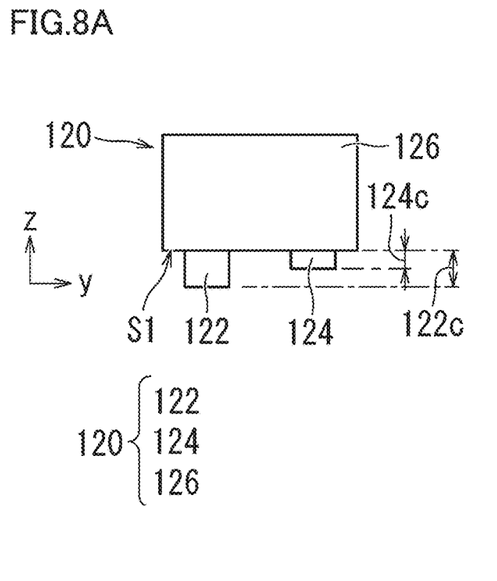
FIG. 8A is a front view of a heat seal trowel according to Preferred Embodiment 3 of the present invention.
Figure 8B:
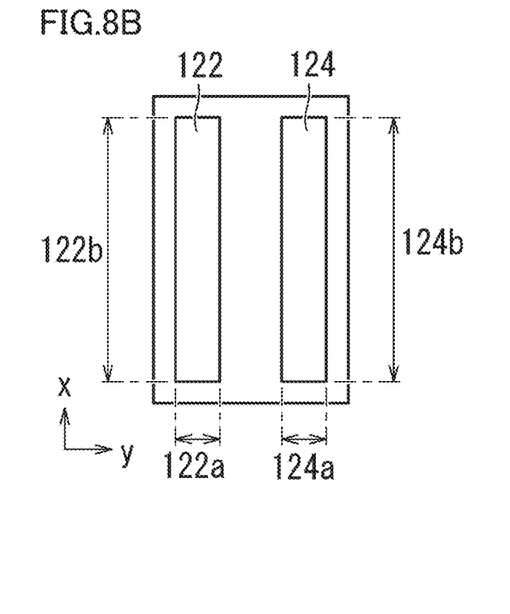
FIG. 8B is a bottom view of the heat seal trowel according to Preferred Embodiment 3 of the present invention.

Preferred Embodiment 3 of heat seal trowel 120 will be described with reference to FIGS. 8A and 8B. FIG. 8A is a front view of the heat seal trowel according to Preferred Embodiment 3 of the present invention. FIG. 8B is a bottom view of the heat seal trowel according to Preferred Embodiment 3 of the present invention.

A surface of heat seal trowel 120 on which first pressing portion 122 and second pressing portion 124 connect with base material 126 is denoted as a reference surface S1. Length 122c of first pressing portion 122 from reference surface S1 of heat seal trowel 120 is preferably larger than length 124c of second pressing portion 124 from reference surface S1 of heat seal trowel 120. As first pressing portion 122 and second pressing portion 124 are provided in this manner, the pressing force exerted on base tape 16 by first pressing portion 122 with cover tape 18 between base tape 16 and first pressing portion 122 can be higher than the pressing force exerted on base tape 16 by second pressing portion 124 with cover tape 18 between base tape 16 and second pressing portion 124.

Preferred Embodiment 4 of Heat Seal Trowel

Figure 9A:
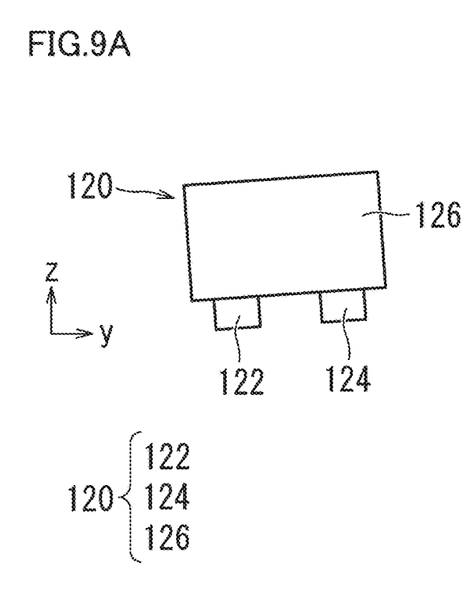
FIG. 9A is a front view of a heat seal trowel according to Preferred Embodiment 4 of the present invention.
Figure 9B:
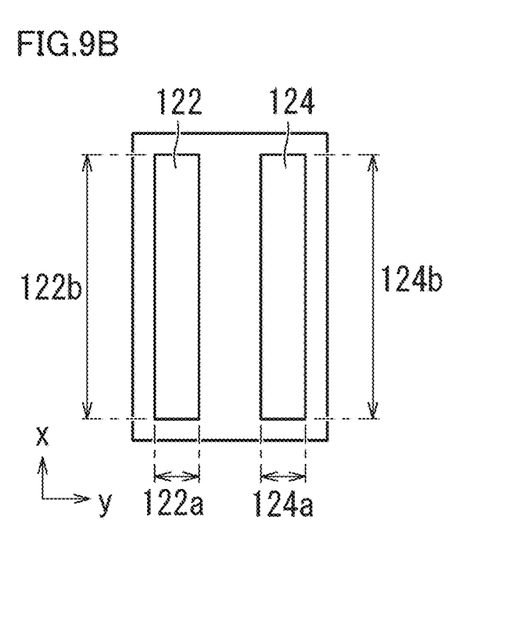
FIG. 9B is a bottom view of the heat seal trowel according to Preferred Embodiment 4 of the present invention.

Preferred Embodiment 4 of heat seal trowel 120 will be described with reference to FIGS. 9A and 9B. FIG. 9A is a front view of the heat seal trowel according to Preferred Embodiment 4 of the present invention. FIG. 9B is a bottom view of the heat seal trowel according to Preferred Embodiment 4 of the present invention.

Heat seal trowel 120 is preferably provided while being inclined such that the pressing force of first seal portion 30 of base tape 16 is higher than the pressing force of second seal portion 40. As welding surfaces of first pressing portion 122 and second pressing portion 124 are provided while being inclined relative to base tape 16 and cover tape 18, the pressing force exerted on base tape 16 by first pressing portion 122 with cover tape 18 between base tape 16 and first pressing portion 122 can be higher than the pressing force exerted on base tape 16 by second pressing portion 124 with cover tape 18 between base tape 16 and second pressing portion 124.

Preferred Embodiment 5 of Heat Seal Trowel

Figure 10A:
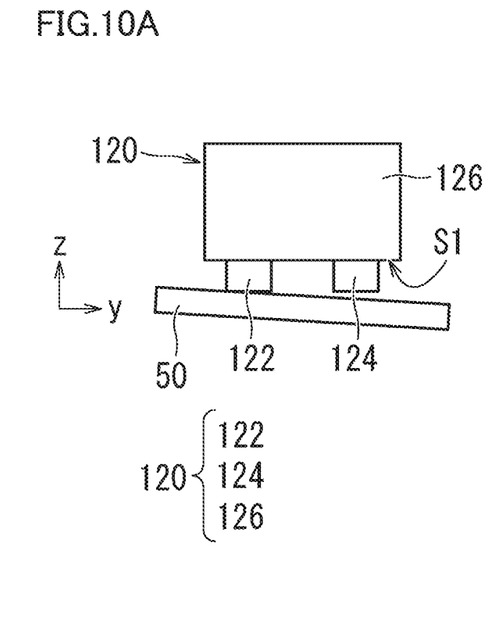
FIG. 10A is a front view of a heat seal trowel according to Preferred Embodiment 5 of the present invention.
Figure 10B:
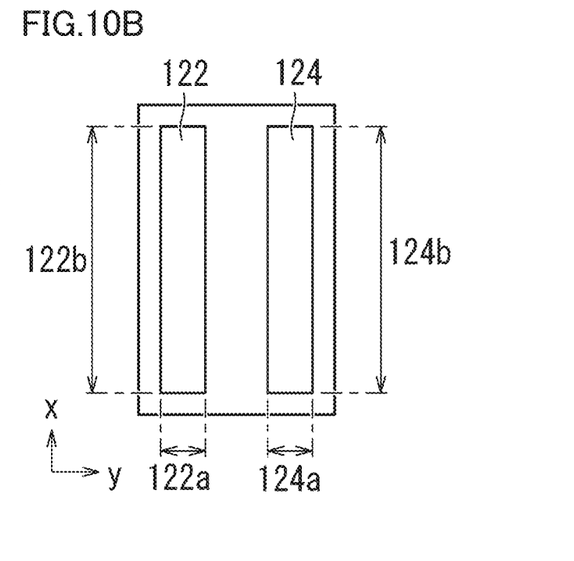
FIG. 10B is a bottom view of the heat seal trowel according to Preferred Embodiment 5 of the present invention.

Preferred Embodiment 5 of heat seal trowel 120 will be described with reference to FIGS. 10A and 10B. FIG. 10A is a front view of the heat seal trowel according to Preferred Embodiment 5 of the present invention. FIG. 10B is a bottom view of the heat seal trowel according to Preferred Embodiment 5 of the present invention.

A welding surface of first pressing portion 122 and second pressing portion 124 is preferably inclined relative to electronic component series 50. As the welding surfaces of first pressing portion 122 and second pressing portion 124 are inclined relative to the transport surface of base tape 16, the pressing force exerted on base tape 16 by first pressing portion 122 with cover tape 18 between base tape 16 and first pressing portion 122 can be higher than the pressing force exerted on base tape 16 by second pressing portion 124 with cover tape 18 between base tape 16 and second pressing portion 124.

First pressing portion 122 and second pressing portion 124 are preferably provided integrally. As first pressing portion 122 and second pressing portion 124 are provided integrally, heat seal trowel 120 can be installed without complicating the shape of heat seal towel 120.

Preferred Embodiment 6 of Heat Seal Trowel

Figure 11A:
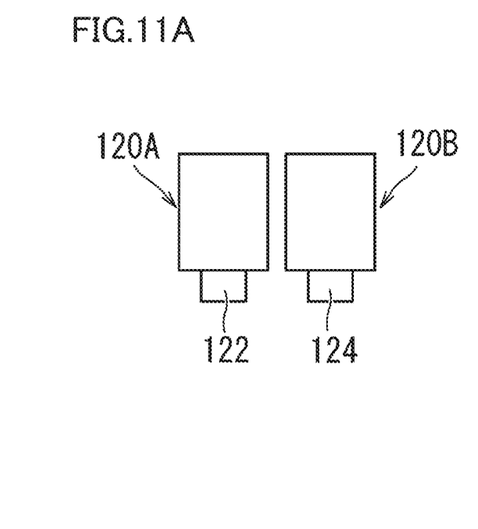
FIG. 11A is a front view of a heat seal trowel according to Preferred Embodiment 6 of the present invention.
Figure 11B:
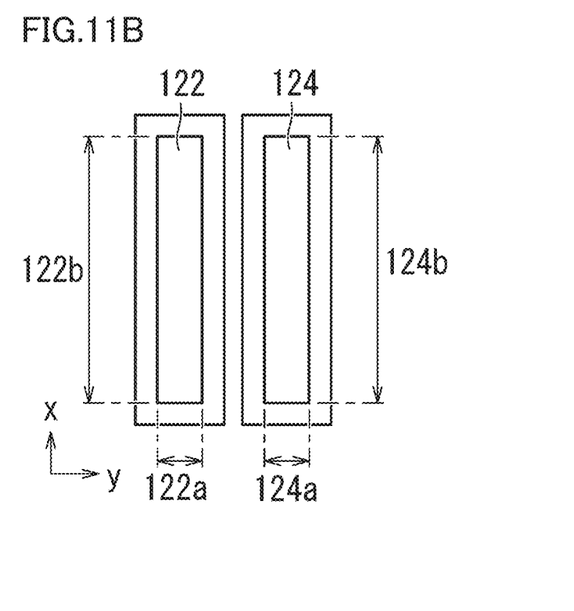
FIG. 11B is a bottom view of the heat seal trowel according to Preferred Embodiment 6 of the present invention.

Preferred Embodiment 6 of heat seal trowel 120 will be described with reference to FIGS. 11A and 11B. FIG. 11A is a front view of the heat seal trowel according to Preferred Embodiment 6 of the present invention. FIG. 11B is a bottom view of the heat seal trowel according to Preferred Embodiment 6 of the present invention.

First pressing portion 122 and second pressing portion 124 may be provided separately. For example, heat seal trowel 120 may include a first heat seal trowel 120A including first pressing portion 122 and a second heat seal trowel 120B including second pressing portion 124. As heat seal trowel 120 includes separate trowels, the temperatures of welding, the pressing forces, and the pressing times of first pressing portion 122 and second pressing portion 124 can be controlled individually.

4. Experimental Data

Electronic component series 50, manufactured by housing multilayer ceramic capacitors 14 in electronic component package 10 according to a preferred embodiment of the present invention as electronic components 14 using electronic component series forming apparatus 100 according to a preferred embodiment of the present invention, was loaded into the automatic component feeder. Then, peelability of electronic component series 50 was measured.

A ratio (A/B) between peeling strengths of first seal portion 30 and second seal portion 40 was adjusted by changing the length of first pressing portion 122 of heat seal trowel 120 in width direction y and the length of second pressing portion 124 of heat seal trowel 120 in width direction y. The ratio (A/B) between the peeling strengths of first seal portion 30 and second seal portion 40 was measured with a peeling tester. The peeling tester PTS-5000 (available from EPI Co., Ltd.) was used. The peeling rate was about 300 cm/min., and an angle of peeling was about 175°.

Ten reels of electronic component series 50 with a measured ratio (A/B) between peeling strengths of first seal portion 30 and second seal portion 40 were prepared for each example. Electronic component series 50 was loaded into the automatic component feeder, and the number of multilayer ceramic capacitors 14 in which poor mounting occurred was measured as peelability of second seal portion 40. Further, electronic component series 50 was loaded into the automatic component feeder, and the number of multilayer ceramic capacitors 14 that had fallen from electronic component series 50 before cover tape 18 peeled off inside the automatic component feeder and the components were mounted in the component mounting device was measured as peelability of first seal portion 30. Table 1 shows the results.

TABLE 1

| | A/B | Peelability of second sealing portion | Peelability of first sealing portion |
| --- | --- | --- | --- |
| Comparative Example 1 | 1.0 | 2 | 1 |
| Example 1 | 1.2 | 0 | 0 |
| Example 2 | 2.0 | 0 | 0 |
| Example 3 | 3.0 | 0 | 0 |
| Example 4 | 4.0 | 0 | 0 |
| Example 5 | 5.0 | 0 | 0 |
| Comparative Example 2 | 6.0 | 2 | 10 |

Table 1 reveals that no poor mounting occurred when the ratio (A/B) between peeling strengths of first seal portion 30 and second seal portion 40 was such that about 1.2≤A/B≤about 5.0.

What is claimed is:

1. An electronic component package comprising:
   a base tape having an elongated shape and a cover tape covering the base tape, the base tape including a plurality of housing portions, each of the plurality of housing portions housing an electronic component; and
   a first seal portion and a second seal portion between the base tape and the cover tape welded to sandwich the plurality of housing portions between the first and second seal portions and be parallel or substantially parallel to a longitudinal direction of the electronic component package; wherein
   a peeling strength of the first seal portion between the base tape and the cover tape is higher than a peeling strength of the second seal portion between the base tape and the cover tape;
   the base tape and the cover tape are welded to each other at only two portions in a width direction perpendicular to the longitudinal direction of the electronic component package, the two portions including the first seal portion and the second seal portion;
   the first seal portion includes a portion of the cover tape that protrudes into a depth of the base tape; and
   the second seal portion includes a portion of the cover tape that protrudes into a depth of the base tape.

2. The electronic component package according to claim 1, wherein about $1.2 \leq A/B \leq$ about 5.0, where A is the peeling strength of the first seal portion between the base tape and the cover tape, and B is the peeling strength of the second seal portion between the base tape and the cover tape.

3. The electronic component package according to claim 1, wherein a length of the first seal portion in a width direction is larger than a length of the second seal portion in the width direction, the width direction being a traverse direction of the electronic component package.

4. The electronic component package according to claim 1, wherein an average depth of the first seal portion is larger than an average depth of the second seal portion.

5. The electronic component package according to claim 1, wherein the electronic component package is sealed over entire or substantially entire lengths of the base tape and the cover tape.

6. The electronic component package according to claim 1, wherein the base tape is made of resin or paper.

7. The electronic component package according to claim 1, wherein the base tape includes one of polystyrene, polyethylene terephthalate, polycarbonate, and polypropylene.

8. An electronic component series comprising:
   the electronic component package according to claim 1; and
   an electronic component in each of the plurality of housing portions.

9. The electronic component series according to claim 8, wherein the electronic component series is usable in a tape feeder that automatically supplies the electronic component.

* * * * *